US012598942B2

(12) United States Patent 　　　　(10) Patent No.:　　US 12,598,942 B2
Cheng et al. 　　　　　　　　　　　　　　(45) Date of Patent:　　　　Apr. 7, 2026

(54) METHOD FOR ANALYZING LAYOUT PATTERN DENSITY

(71) Applicant: Shanghai Huali Microelectronics Corporation, Shanghai (CN)

(72) Inventors: Wei Cheng, Shanghai (CN); Zhonghua Zhu, Shanghai (CN); Fang Wei, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 547 days.

(21) Appl. No.: 18/342,366

(22) Filed: Jun. 27, 2023

(65) Prior Publication Data

US 2024/0145280 A1　　May 2, 2024

(30) Foreign Application Priority Data

Oct. 31, 2022　(CN) .......................... 202211374527.1

(51) Int. Cl.
*H10P 72/00*　　　　(2026.01)
*G06T 7/00*　　　　(2017.01)

(52) U.S. Cl.
CPC ........ *H10P 72/0616* (2026.01); *G06T 7/0006* (2013.01); *G06T 2207/10024* (2013.01); *G06T 2207/30148* (2013.01)

(58) Field of Classification Search
None
See application file for complete search history.

*Primary Examiner* — Sarah K Salerno
(74) *Attorney, Agent, or Firm* — Quarles & Brady LLP

(57)　　　　　　　　ABSTRACT

The present application discloses a method for analyzing a layout pattern density, comprising: step 1, providing layouts of a chip, and merging the layouts to form a wafer level layout, wherein the wafer level layout presents a first circle in a top view, and the layout comprises a plurality of mask layers; step 2, segmenting the first circle to form a plurality of check windows; step 3, searching for the mask layer containing the patterns having a height morphology, and combining the found mask layers into a pattern layer combination; step 4, sequentially calculating a pattern density of the pattern layer combination in each check window; and step 5, recording the pattern density in each check window on a third circle to form a wafer level pattern density distribution diagram. The present application can predict a height morphology of a top surface of a wafer related to a layout.

15 Claims, 9 Drawing Sheets

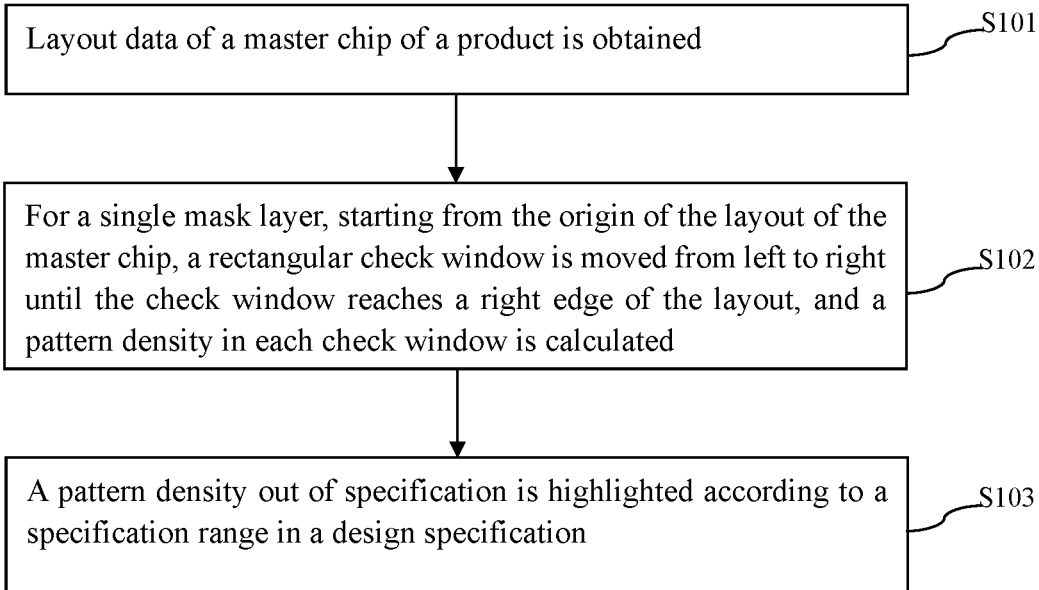

| Layout data of a master chip of a product is obtained | S101 |

| For a single mask layer, starting from the origin of the layout of the master chip, a rectangular check window is moved from left to right until the check window reaches a right edge of the layout, and a pattern density in each check window is calculated | S102 |

| A pattern density out of specification is highlighted according to a specification range in a design specification | S103 |

FIG. 1(Prior Art)

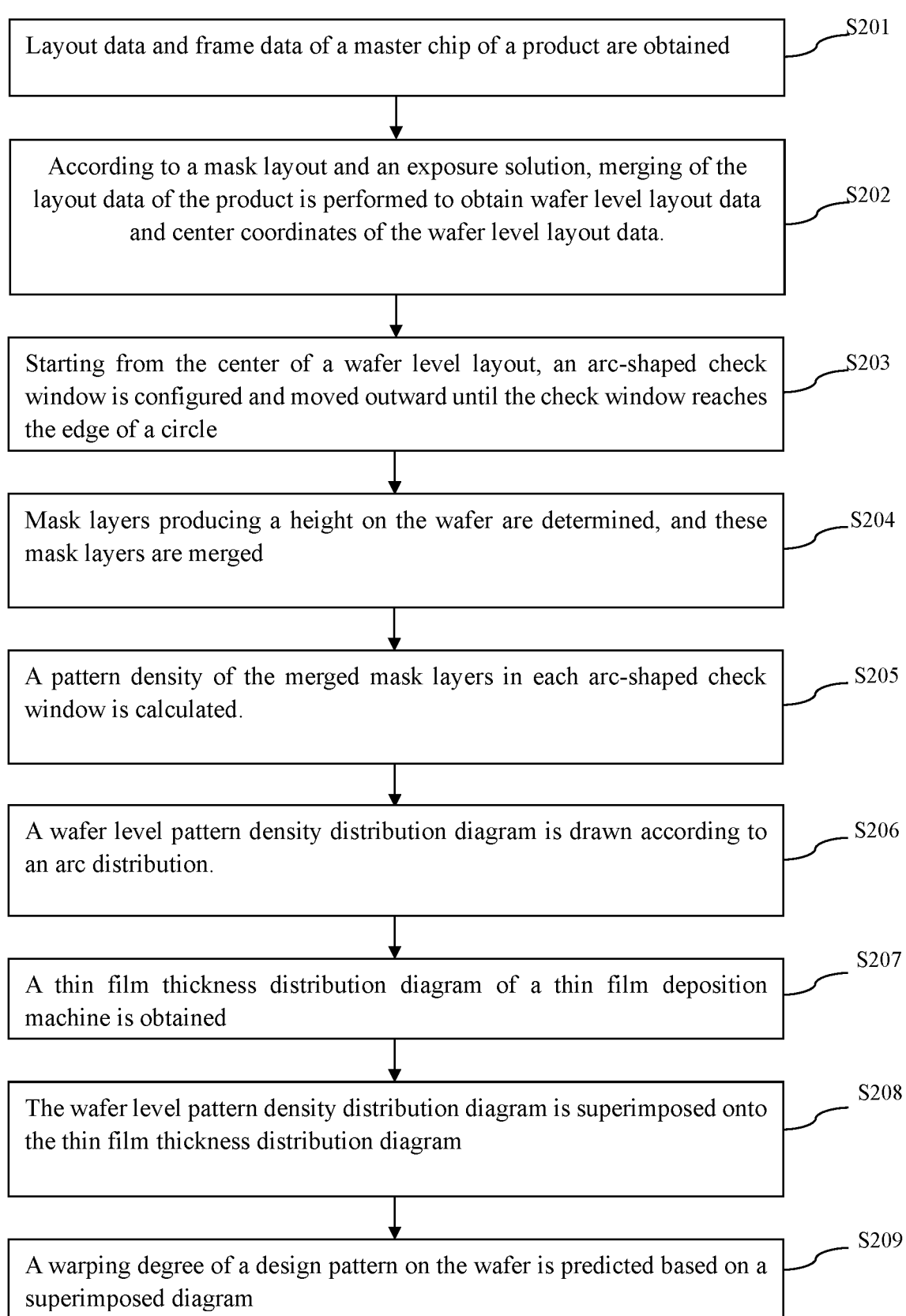

Layout data and frame data of a master chip of a product are obtained ⟋S201

According to a mask layout and an exposure solution, merging of the layout data of the product is performed to obtain wafer level layout data and center coordinates of the wafer level layout data. ⟋S202

Starting from the center of a wafer level layout, an arc-shaped check window is configured and moved outward until the check window reaches the edge of a circle ⟋S203

Mask layers producing a height on the wafer are determined, and these mask layers are merged ⟋S204

A pattern density of the merged mask layers in each arc-shaped check window is calculated. ⟋S205

A wafer level pattern density distribution diagram is drawn according to an arc distribution. ⟋S206

A thin film thickness distribution diagram of a thin film deposition machine is obtained ⟋S207

The wafer level pattern density distribution diagram is superimposed onto the thin film thickness distribution diagram ⟋S208

A warping degree of a design pattern on the wafer is predicted based on a superimposed diagram ⟋S209

METHOD FOR ANALYZING LAYOUT PATTERN DENSITY

CROSS-REFERENCES TO RELATED APPLICATIONS

This application claims the priority to Chinese patent application No. CN 202211374527.1, filed on Oct. 31, 2022, and entitled "METHOD FOR ANALYZING LAYOUT PATTERN DENSITY", the disclosure of which is incorporated herein by reference in entirety.

TECHNICAL FIELD

The present application relates to a method for manufacturing a semiconductor integrated circuit, in particular to a method for analyzing a layout pattern density.

BACKGROUND

With the development of semiconductors, the deep trench technique is applied in increasingly more processes. During a manufacturing process of the deep trench technique, a severe warp of a wafer may occur. The presence of the warp leads to poor process capability during the production process, e.g., an overlay (OVL) problem, and causes a relatively large stress on the wafer, resulting in a broken wafer during transportation or subsequent cutting and packaging processes. How to improve the warping degree of the wafer is an important research topic in the semiconductor manufacturing process.

In the semiconductor manufacturing process, a layout of a designed circuit is first formed, then the layout is transformed into actual patterns on the wafer, and the actual patterns form the actual circuit on a chip. The layout typically includes a plurality of mask layers, and each mask layer includes a plurality of patterns. The patterns of the mask layer are produced on a reticle, and then transferred to the wafer by means of a photolithography process. The entire chip manufacturing process of the wafer requires a plurality of photolithography processes to form patterns of each layer. In the actual wafer manufacturing process, patterns of a mask layer may have a height, for example, patterns such as a planar gate structure and a metal wire each have a height morphology. Patterns of a mask layer corresponding to an active region typically have no height morphology.

With the development of the integrated circuit technology, layout patterns become increasingly complex, and the pattern density analysis becomes an important step in the data analysis of many key mask layers. In the semiconductor manufacturing process, whether a pattern density distribution is uniform has a significant impact on an etching process and a chemical mechanical polishing process. In the case of a nonuniform pattern density distribution, the loading effect in etching is prone to aggravation, resulting in a deviation of a final dimension of a pattern from a target dimension, and the pattern is prone to over-polishing in the chemical mechanical polishing process. In an existing method for analyzing a layout pattern density, the pattern density analysis is typically performed on only patterns of only a single mask layer of the layout.

FIG. 1 is a flowchart of an existing method for analyzing a layout pattern density. The existing method for analyzing a layout pattern density includes the following steps:

Step S101. Layout data of a master chip of a product is obtained. A layout of the master chip includes a plurality of mask layers, and patterns of each mask layer are formed in a corresponding mask. During formation of the designed patterns of the mask layer on a wafer, the patterns can be produced on the wafer by performing photolithography processes such as exposure and development on the corresponding mask. A product generally requires a plurality of photolithography processes.

Step S102. For a single mask layer, starting from the origin of the layout of the master chip, a rectangular check window is moved from left to right until the check window reaches a right edge of the layout, and a pattern density in each check window is calculated.

Step S103. A pattern density out of specification (oos) is highlighted according to a specification range (spec) in a design specification.

Since steps S102 and S103 both can only achieve a check of the pattern density of a single mask layer, and the layout of the master chip includes a plurality of mask layers, in the existing method, a check of pattern densities of all mask layers of the layout of the master chip can only be achieved by repeating steps S102 and S103 a plurality of times.

It can be seen that the existing method for analyzing a layout pattern density can only achieve a check of the pattern density of a single mask layer, and cannot achieve an analysis of a superimposed impact of different mask layers. In addition, since a plurality of chips are arranged on the same wafer, the existing method likewise cannot achieve an analysis of an impact of the product chip layout on the wafer. If the actual morphology of the wafer can be predicted and analyzed by analyzing the layout pattern density, the design for manufacture (DFM) of a layout design can be improved necessarily.

BRIEF SUMMARY

According to some embodiments in this application, a method for analyzing a layout pattern density is disclosed in the following steps:

step 1, providing layouts of a chip, repeatedly arrange the layouts, and merging the repeatedly arranged layouts to form a wafer level layout, wherein the wafer level layout presents a first circle in a top view, the size of the first circle is the same as the size of a second circle of a wafer used in a production line, the layout includes a plurality of mask layers, and each mask layer includes a plurality of patterns;

step 2, segmenting the first circle to form a plurality of check windows;

step 3, searching for the mask layer containing the patterns having a height morphology, and combining the found mask layers into a pattern layer combination;

step 4, sequentially calculating a pattern density of the pattern layer combination in each check window; and step 5, recording the pattern density in each check window on a third circle to form a wafer level pattern density distribution diagram, wherein the size of the third circle is the same that of the first circle, and the position of each pattern density in the third circle is the same as the position of the check window corresponding to the pattern density in the first circle.

In some cases, the method further includes:

step 6, providing a thin film thickness distribution diagram on the wafer related to a thin film deposition machine.

Due to a feature of the patterns having the height morphology in the pattern layer combination, the wafer level pattern density distribution diagram is equivalent to a height morphology distribution diagram of a top surface of the wafer, and the thin film thickness distribution diagram is superimposed onto the wafer level pattern density distribution diagram to form an overall height morphology distribution diagram of the wafer; and whether a warp occurs on the wafer and a warp position where the warp occurs are predicted according to the overall height morphology distribution diagram.

In some cases, step 5 further includes converting a numerical value of the pattern density in the wafer level pattern density distribution diagram into a corresponding color to form a second wafer level pattern density distribution diagram.

In some cases, each thickness in the thin film thickness distribution diagram is also represented by a corresponding color.

The overall height morphology distribution diagram is formed by superimposing the thin film thickness distribution diagram onto the second wafer level pattern density distribution diagram.

Each region of the overall height morphology distribution diagram is also represented by a corresponding color.

In some cases, in step 1, the chip is a master chip of a product, and the wafer level layout is formed by merging the layouts of the master chip.

In some cases, substeps of merging for forming the wafer level layout in step 1 include:

step 11, preparing layout data and frame data of the master chip of the product; and step 12, performing the layout merging by combining a mask layout and exposure process parameters with the layout data and frame data of the master chip, so as to obtain the wafer level layout.

In some cases, the product further includes an auxiliary chip, and layout data and frame data of all the auxiliary chips of the product are prepared simultaneously in step 11.

In some cases, the wafer level layout in step 12 is equivalent to an actual layout formed on the wafer after exposure using a mask of the layout of the master chip.

In some cases, the check window in step 2 is arc-shaped.

In some cases, step 2 includes the following substeps:

step 21, segmenting the first circle into a plurality of sectors; and step 22, forming a plurality of concentric circles between the center and the edge of the first circle, wherein each concentric circle segments each sector to form the corresponding check window.

In some cases, radians of all the sectors in step 21 are equal.

In some cases, a radius difference between two adjacent concentric circles is constant.

In some cases, the patterns having the height morphology in step 3 have an impact on a height morphology of the top surface of the wafer.

In some cases, all the mask layers having an impact on a height morphology of the wafer are found in step 3.

In some cases, step 4 includes the following substeps:

step 41, performing a logical OR operation on the patterns of each mask layer in the pattern layer combination to obtain an overall pattern of the pattern layer combination; and step 42, calculating a density of the overall pattern in each check window, wherein the density of the overall pattern is used as the pattern density of the pattern layer combination.

In the present application, the layouts of the chip are merged into the wafer level layout, then the mask layers of the patterns having the height morphology in the layout are found and combined into the pattern layer combination, and then the pattern density of the pattern layer combination in the check window formed by segmenting the wafer level layout is calculated, so as to obtain the wafer level pattern density distribution diagram related to the morphology of the top surface of the wafer. Therefore, the present application can obtain the wafer level density distribution diagram of the patterns having the height morphology, so as to predict the height morphology of the top surface of the wafer related to the layout.

In addition, the present application can obtain the overall height morphology distribution diagram of the wafer on the basis of the thin film thickness distribution diagram related only to the thin film deposition machine, and the actual height morphology of the wafer can be predicted on the basis of the overall height morphology distribution diagram of the wafer. Therefore, the present application can predict the actual height morphology of the wafer, so as to predict whether a warp occurs on the wafer and a warp position where the warp occurs.

BRIEF DESCRIPTION OF THE DRAWINGS

The present application will be further described in detail below with reference to the drawings and specific implementations:

FIG. 1 is a flowchart of an existing method for analyzing a layout pattern density.

FIG. 2 is a flowchart of a method for analyzing a layout pattern density according to an embodiment of the present application.

DETAILED DESCRIPTION OF THE DISCLOSURE

Figure 3:
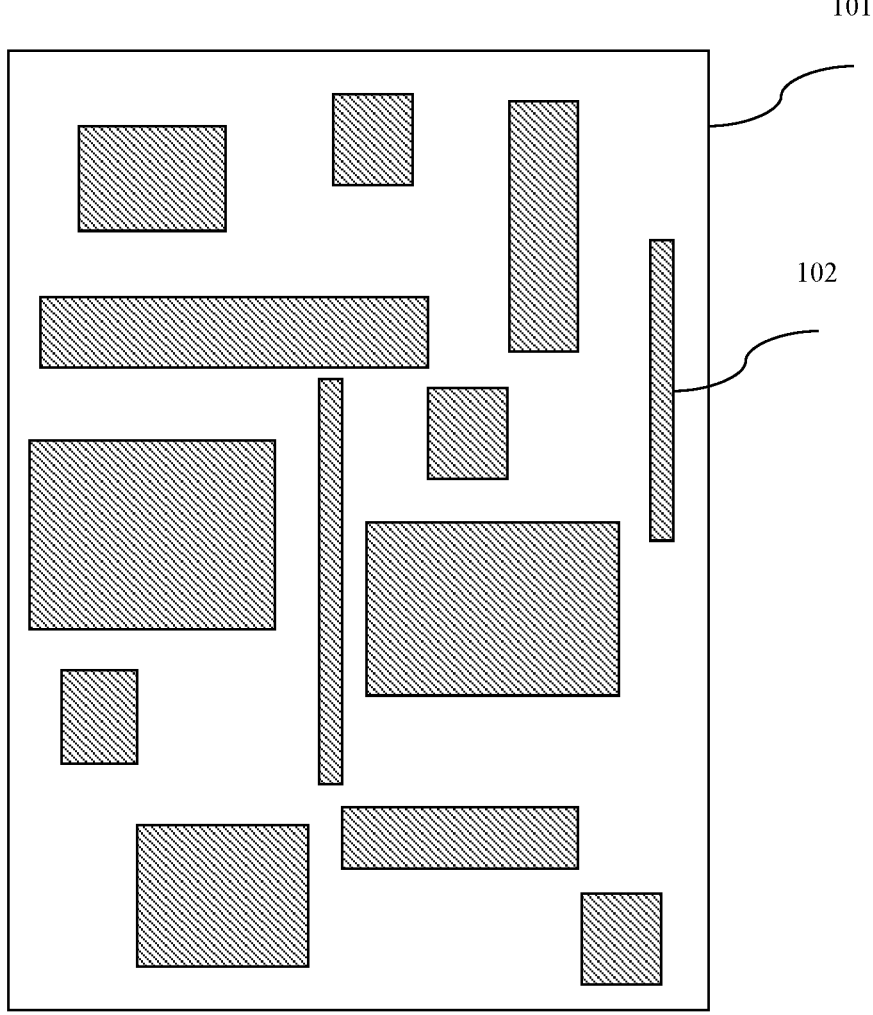
FIG. 3 is a schematic diagram of layouts of a chip in the method for analyzing a layout pattern density according to an embodiment of the present application.

FIG. 2 is a flowchart of a method for analyzing a layout 101 pattern density according to an embodiment of the present application. The method for analyzing a layout 101 pattern density of this embodiment of the present application includes the following steps:

Step 1. Referring to FIG. 3, layouts 101 of a chip are provided.

The layout 101 includes a plurality of mask layers, and each mask layer includes a plurality of patterns 102. In FIG. 3, the patterns 102 corresponding to only one of the mask layers are shown in FIG. 3.

Figure 4:
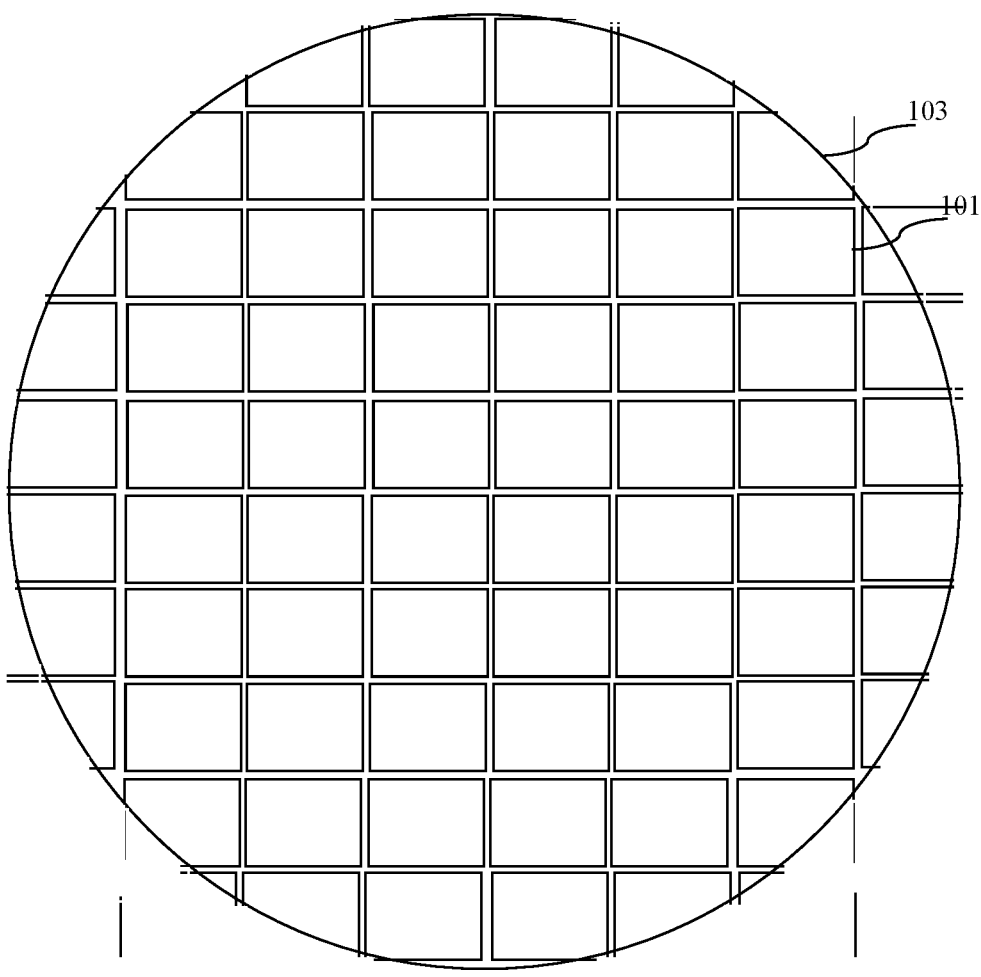
FIG. 4 is a schematic diagram of a wafer level layout in the method for analyzing a layout pattern density according to an embodiment of the present application.

Referring to FIG. 4, the layouts 101 are repeatedly arranged, and the repeatedly arranged layouts 101 are merged to form a wafer level layout 103, wherein the wafer level layout 103 presents a first circle in a top view, the size of the first circle is the same as the size of a second circle of a wafer used in a production line.

In the method of this embodiment of the present application, the chip is a master chip of a product, and the wafer level layout 103 is formed by merging the layouts 101 of the master chip.

Substeps of merging for forming the wafer level layout 103 in step 1 include:

Step 11. Layout 101 data and frame data of the master chip of the product are prepared. Step 11 is equivalent to step S201 in FIG. 2.

In some embodiments, the product further includes an auxiliary chip, and layout 101 data and frame data of all the auxiliary chips of the product need to be prepared simultaneously in step 11.

Step 12. The layout 101 merging is performed by combining a mask layout and exposure process parameters with the layout 101 data and frame data of the master chip, so as to obtain the wafer level layout 103. The coordinates of the center of the wafer level layout 103 can also be obtained. Step 11 is equivalent to step S202 in FIG. 2.

The wafer level layout 103 is equivalent to an actual layout formed on the wafer after exposure using a mask of the layout 101 of the master chip. That is, the wafer level layout 103 can simulate the actual layout on the wafer.

Step 2. The first circle is segmented to form a plurality of check windows. Step 2 corresponds to step S203 in FIG. 2.

Figure 5:
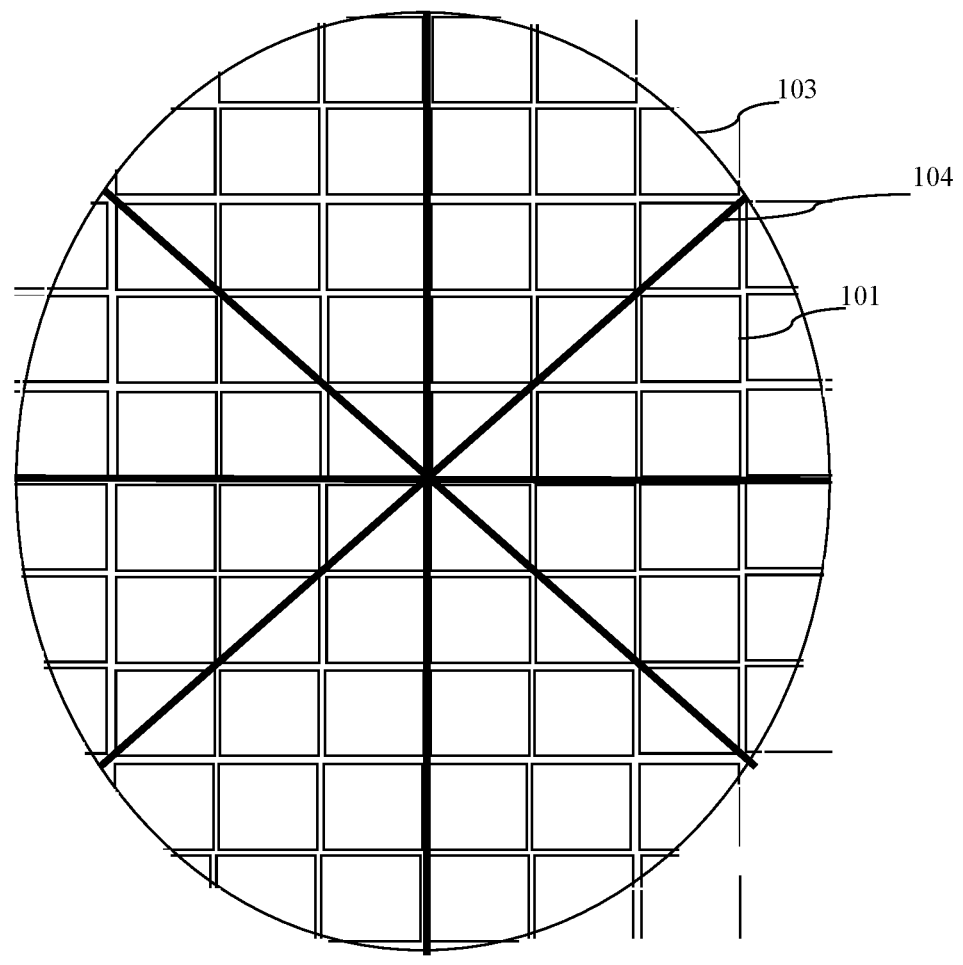
FIG. 5 is a schematic diagram of segmenting a first circle into a plurality of sectors in the method for analyzing a layout pattern density according to an embodiment of the present application.

In the method of this embodiment of the present application, the check window in step 2 is arc-shaped. Step 2 includes the following substeps:

Step 21. Referring to FIG. 5, the first circle is segmented into a plurality of sectors. A plurality of radius lines 104 are shown in FIG. 4, and a sector is formed between two adjacent radius lines 104.

In some embodiments, radians of all the sectors are equal. In other embodiments, radians of all the sectors may be different.

Figure 6:
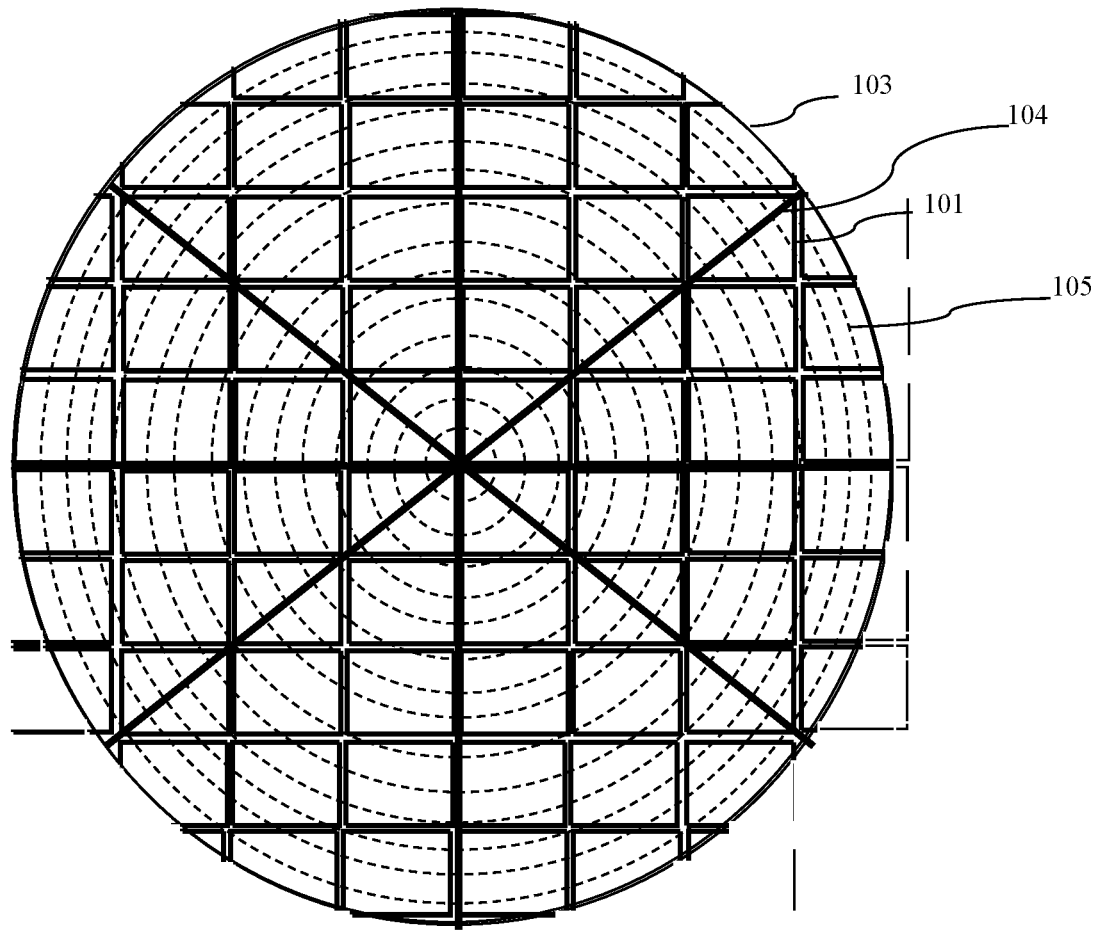
FIG. 6 is a schematic diagram of segmenting the plurality of sectors shown in FIG. 5 by using a plurality of concentric circles to form a plurality of check windows.

Step 22. Referring to FIG. 6, a plurality of concentric circles 105 are formed between the center and the edge of the first circle, wherein each concentric circle 105 segments each sector to form the corresponding check window.

In some embodiments, a radius difference between two adjacent concentric circles 105 is constant. In other embodiments, a radius difference between two adjacent concentric circles 105 may vary.

Figure 6A:
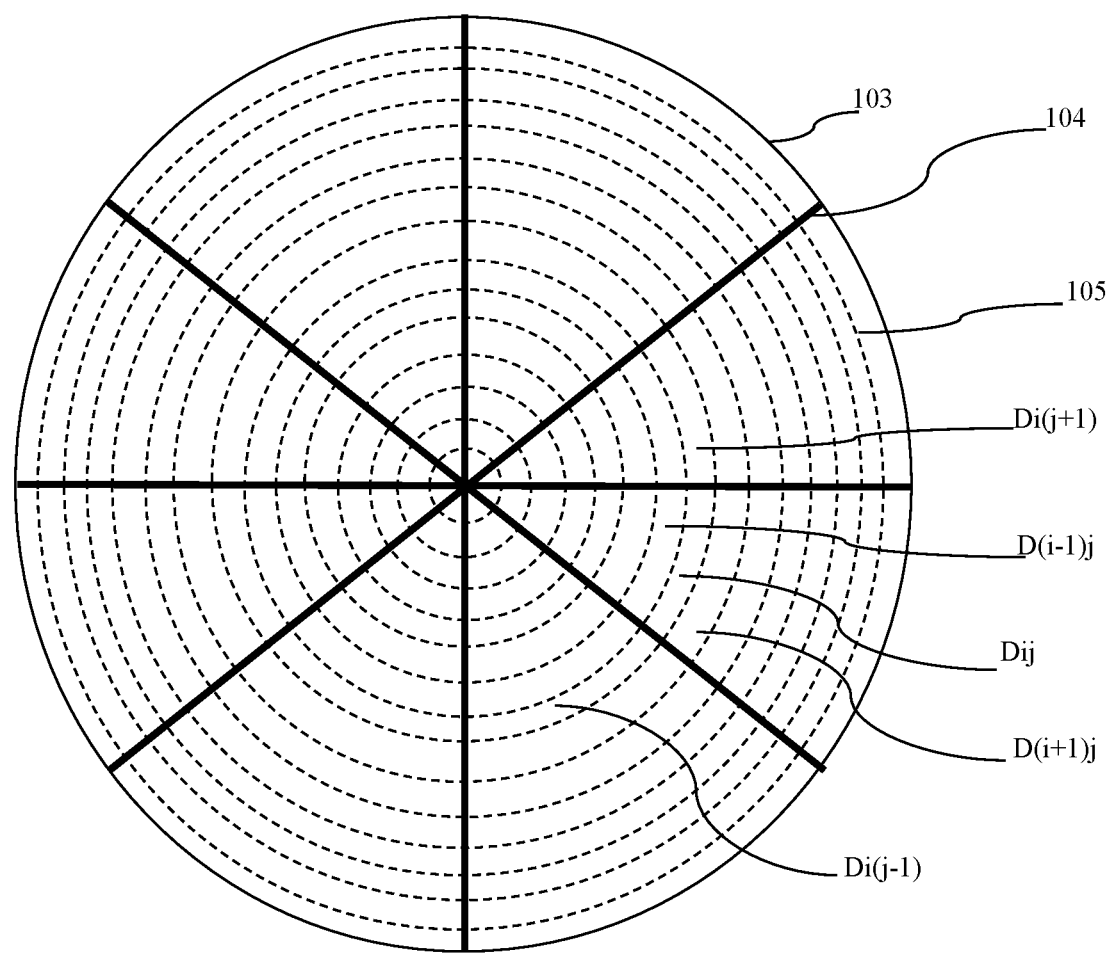
FIG. 6A is a simplified diagram formed by not displaying the layouts of the chip in FIG. 6.

FIG. 6A is a simplified diagram of FIG. 6, and FIG. 6A provides a clearer display of the check window. The check window corresponding to a serial number Dij is shown in FIG. 6A, wherein i represents a serial number of a region between the concentric circles 105 and j represents a serial number of the sector. The check windows corresponding to D(i−1)j, D(i+1)j, Di(j−1), and Di(j+1) are also shown in FIG. 6A. Therefore, the check window at each position can be determined by a serial number.

Step 3. A search for the mask layer containing the patterns 102 having a height morphology is performed, and the found mask layers are combined into a pattern layer combination. Step 3 corresponds to step S204 in FIG. 2.

In the method of this embodiment of the present application, the patterns 102 having the height morphology have an impact on a height morphology of the top surface of the wafer. The patterns 102 having the height morphology include a planar gate structure, a metal wire, and various trench structures. In some preferred embodiments, all the mask layers having an impact on a height morphology of the wafer are found in step 3. In other embodiments, the mask layer having a significant impact on the height morphology of the wafer is found as needed.

Step 4. A pattern density of the pattern layer combination in each check window is sequentially calculated.

Step 4 corresponds to step S205 in FIG. 2.

In the method of this embodiment of the present application, step 4 includes the following substeps:

Step 41. A logical OR operation is performed on the patterns 102 of each mask layer in the pattern layer combination to obtain an overall pattern of the pattern layer combination. Step 42. A density of the overall pattern in each check window is calculated, wherein the density of the overall pattern is used as the pattern density of the pattern layer combination. For example, in some embodiments, the product includes a laminate that has a height, i.e., pattern layer combination, which is represented by L. L includes four layers which are represented by La, Lb, Lc, and Ld, respectively. The overall pattern is formed by a logical OR operation of patterns in the La, Lb, Lc, and Ld layers. The pattern density is a density of the patterns formed by the logical OR operation of the patterns in the La, Lb, Lc, and Ld layers.

Step 5. The pattern density in each check window is recorded on a third circle to form a wafer level pattern density distribution diagram, wherein the size of the third circle is the same that of the first circle, and the position of each pattern density in the third circle is the same as the position of the check window corresponding to the pattern density in the first circle. The position of the check window in the first circle is represented by the serial number Dij in FIG. 6A.

Step 5 corresponds to step S206 in FIG. 2.

The method of this embodiment of the present application further includes the following step:

Step 6. A thin film thickness distribution diagram 201 on the wafer related to a thin film deposition machine is provided. Step 6 corresponds to step S207 in FIG. 2.

Referring to step S208 in FIG. 2, due to a feature of the patterns 102 having the height morphology in the pattern layer combination, the wafer level pattern density distribution diagram is equivalent to a height morphology distribution diagram of a top surface of the wafer, and the thin film thickness distribution diagram 201 is superimposed onto the wafer level pattern density distribution diagram to form an overall height morphology distribution diagram 202 of the wafer. The overall height morphology distribution diagram 202 is a superimposed diagram.

Referring to step S209 in FIG. 2, whether a warp occurs on the wafer and a warp position where the warp occurs are predicted according to the overall height morphology distribution diagram 202.

In some embodiments, step 5 further includes: converting a numerical value of the pattern density in the wafer level pattern density distribution diagram into a corresponding color to form a second wafer level pattern density distribution diagram.

Figure 7:
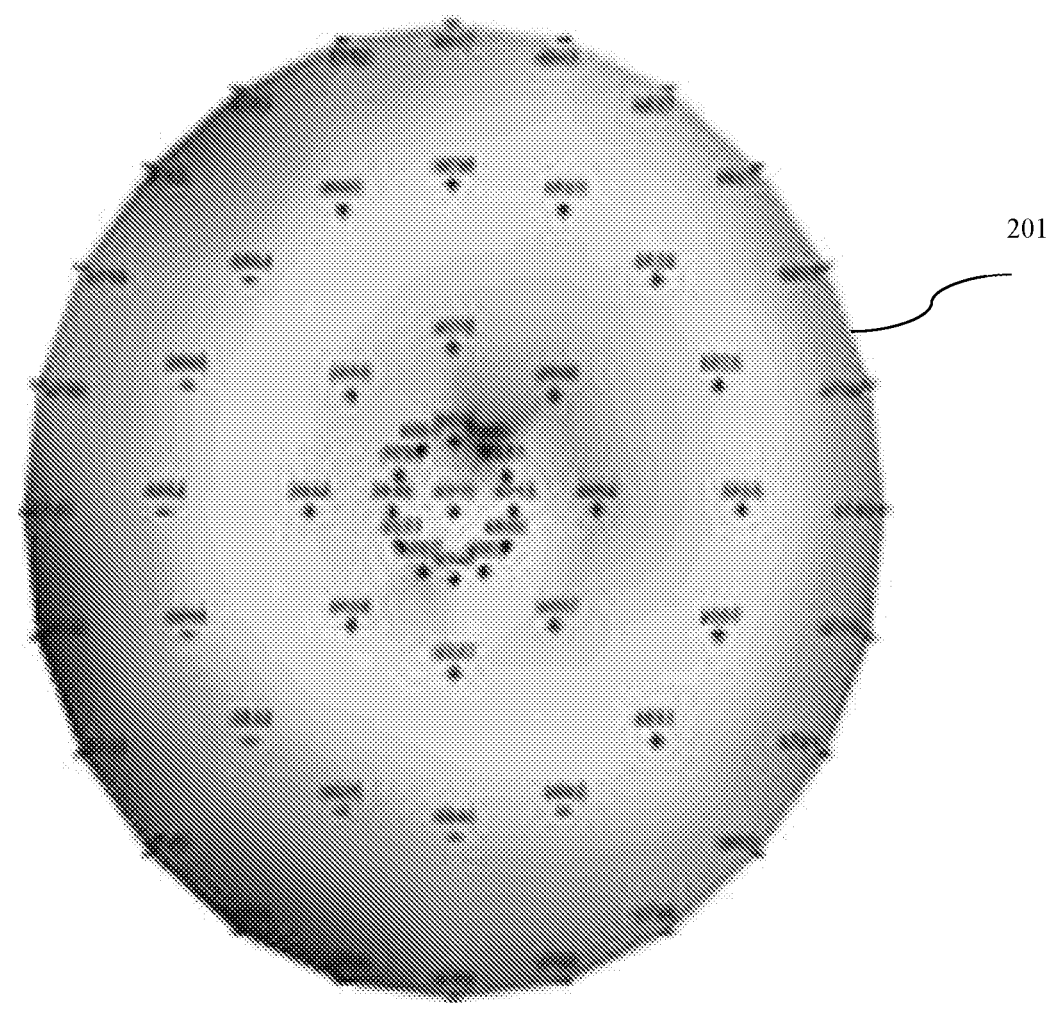
FIG. 7 is a schematic diagram of a thin film thickness distribution diagram in the method for analyzing a layout pattern density according to an embodiment of the present application.

Referring to FIG. 7, FIG. 7 is a schematic diagram of the thin film thickness distribution diagram 201 in the method for analyzing a layout pattern density according to this embodiment of the present application. Each thickness in the thin film thickness distribution diagram 201 is also represented by a corresponding color.

Figure 8:
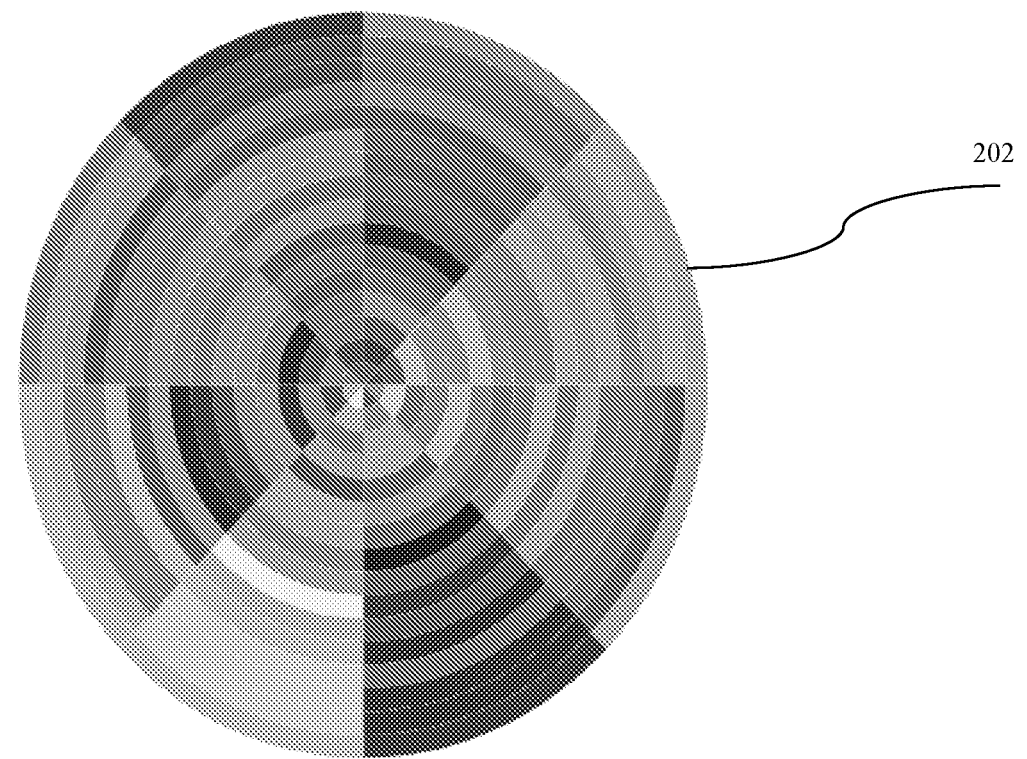
FIG. 8 is a schematic diagram of an overall height morphology distribution diagram of the wafer obtained by the method for analyzing a layout pattern density according to an embodiment of the present application.

FIG. 8 is a schematic diagram of the overall height morphology distribution diagram 202 of the wafer obtained by the method for analyzing a layout pattern density according to this embodiment of the present application. The overall height morphology distribution diagram 202 is formed by superimposing the thin film thickness distribution diagram 201 onto the second wafer level pattern density distribution diagram. Each region of the overall height morphology distribution diagram 202 is also represented by a corresponding color. From the color shown in FIG. 8, it can be directly determined that the possibility of a warp is present in 5 o'clock and 11 o'clock directions of the product. FIG. 8 only shows one situation, and the overall height morphology distribution diagram 202 can vary according to different actual product layouts. Therefore, a product layout design can be optimized based on the display in FIG. 8, thus improving the manufacturability of the layout design.

In this embodiment of the present application, the layouts 101 of the chip are merged into the wafer level layout 103, then the mask layers of the patterns 102 having the height morphology in the layout 101 are found and combined into the pattern layer combination, and then the pattern density of the pattern layer combination in the check window formed by segmenting the wafer level layout 103 is calculated, so as to obtain the wafer level pattern density distribution diagram related to the morphology of the top surface of the wafer. Therefore, this embodiment of the present application can obtain the wafer level density distribution diagram of the patterns 102 having the height morphology, so as to predict the height morphology of the top surface of the wafer related to the layout 101.

In addition, this embodiment of the present application can obtain the overall height morphology distribution diagram 202 of the wafer on the basis of the thin film thickness distribution diagram 201 related only to the thin film deposition machine, and the actual height morphology of the wafer can be predicted on the basis of the overall height morphology distribution diagram of the wafer. Therefore, this embodiment of the present application can predict the actual height morphology of the wafer, so as to predict whether a warp occurs on the wafer and a warp position where the warp occurs.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for analyzing a layout pattern density, comprising the following steps:
    step 1, providing layouts of a chip, repeatedly arrange the layouts, and merging the repeatedly arranged layouts to form a wafer level layout, wherein the wafer level layout presents a first circle in a top view, the size of the first circle is the same as the size of a second circle of a wafer used in a production line, the layout comprises a plurality of mask layers, and each mask layer comprises a plurality of patterns;
    step 2, segmenting the first circle to form a plurality of check windows;

step 3, searching for the mask layer containing the patterns having a height morphology, and combining the found mask layers into a pattern layer combination;
    step 4, sequentially calculating a pattern density of the pattern layer combination in each check window; and
    step 5, recording the pattern density in each check window on a third circle to form a wafer level pattern density distribution diagram, wherein the size of the third circle is the same that of the first circle, and the position of each pattern density in the third circle is the same as the position of the check window corresponding to the pattern density in the first circle.

2. The method for analyzing a layout pattern density according to claim 1, further comprising:
    step 6, providing a thin film thickness distribution diagram on the wafer related to a thin film deposition machine; wherein
    due to a feature of the patterns having the height morphology in the pattern layer combination, the wafer level pattern density distribution diagram is equivalent to a height morphology distribution diagram of a top surface of the wafer, and the thin film thickness distribution diagram is superimposed onto the wafer level pattern density distribution diagram to form an overall height morphology distribution diagram of the wafer; and whether a warp occurs on the wafer and a warp position where the warp occurs are predicted according to the overall height morphology distribution diagram.

3. The method for analyzing a layout pattern density according to claim 2, wherein step 5 further comprises converting a numerical value of the pattern density in the wafer level pattern density distribution diagram into a corresponding color to form a second wafer level pattern density distribution diagram.

4. The method for analyzing a layout pattern density according to claim 3, wherein each thickness in the thin film thickness distribution diagram is also represented by a corresponding color;
    the overall height morphology distribution diagram is formed by superimposing the thin film thickness distribution diagram onto the second wafer level pattern density distribution diagram; and
    each region of the overall height morphology distribution diagram is also represented by a corresponding color.

5. The method for analyzing a layout pattern density according to claim 2, in step 1, the chip is a master chip of a product, and the wafer level layout is formed by merging the layouts of the master chip.

6. The method for analyzing a layout pattern density according to claim 5, wherein substeps of merging for forming the wafer level layout in step 1 comprise:
    step 11, preparing layout data and frame data of the master chip of the product; and
    step 12, performing the layout merging by combining a mask layout and exposure process parameters with the layout data and frame data of the master chip, so as to obtain the wafer level layout.

7. The method for analyzing a layout pattern density according to claim 6, wherein the product further comprises an auxiliary chip, and layout data and frame data of all the auxiliary chips of the product are prepared simultaneously in step 11.

8. The method for analyzing a layout pattern density according to claim 6, wherein the wafer level layout in step 12 is equivalent to an actual layout formed on the wafer after exposure using a mask of the layout of the master chip.

9. The method for analyzing a layout pattern density according to claim 1, wherein the check window in step 2 is arc-shaped.

10. The method for analyzing a layout pattern density according to claim 9, wherein step 2 comprises the following substeps:

step 21, segmenting the first circle into a plurality of sectors; and step 22, forming a plurality of concentric circles between the center and the edge of the first circle, wherein each concentric circle segments each sector to form the corresponding check window.

11. The method for analyzing a layout pattern density according to claim 10, wherein radians of all the sectors in step 21 are equal.

12. The method for analyzing a layout pattern density according to claim 10, wherein a radius difference between two adjacent concentric circles is constant.

13. The method for analyzing a layout pattern density according to claim 1, wherein the patterns having the height morphology in step 3 have an impact on a height morphology of the top surface of the wafer.

14. The method for analyzing a layout pattern density according to claim 1, wherein all the mask layers having an impact on a height morphology of the wafer are found in step 3.

15. The method for analyzing a layout pattern density according to claim 1, wherein step 4 comprises the following substeps:

step 41, performing a logical OR operation on the patterns of each mask layer in the pattern layer combination to obtain an overall pattern of the pattern layer combination; and step 42, calculating a density of the overall pattern in each check window, wherein the density of the overall pattern is used as the pattern density of the pattern layer combination.

* * * * *